United States Patent
Shieh et al.

(10) Patent No.: US 9,040,333 B2
(45) Date of Patent: May 26, 2015

(54) METHOD FOR FABRICATING POWER-GENERATING MODULE WITH SOLAR CELL

(71) Applicant: NATIONAL APPLIED RESEARCH LABORATORIES, Taipei (TW)

(72) Inventors: Jia-Min Shieh, Hsinchu (TW); Chang-Hong Shen, Hsinchu (TW); Wen-Hsien Huang, Hsinchu (TW); Bau-Tong Dai, Hsinchu (TW); Jung Y. Huang, Hsinchu (TW); Hao-Chung Kuo, Zhubei (TW)

(73) Assignee: National Applied Research Laboratories, Taipei (TW)

( * ) Notice: Subject to any disclaimer, the term of this patent is extended or adjusted under 35 U.S.C. 154(b) by 0 days.

(21) Appl. No.: 14/075,472

(22) Filed: Nov. 8, 2013

(65) Prior Publication Data

US 2014/0065754 A1 Mar. 6, 2014

Related U.S. Application Data

(62) Division of application No. 13/158,045, filed on Jun. 10, 2011.

(30) Foreign Application Priority Data

Apr. 11, 2011 (TW) .............................. 100112482 A

(51) Int. Cl.
  H01L 31/062 (2012.01)
  H01L 27/142 (2014.01)
(52) U.S. Cl.
  CPC .................................. H01L 27/1423 (2013.01)
(58) Field of Classification Search
  CPC .................................................... H01L 27/1423
  USPC ......................................................... 438/48
  See application file for complete search history.

(56) References Cited

U.S. PATENT DOCUMENTS

| | | | |
|---|---|---|---|
| 2002/0134981 A1* | 9/2002 | Nakamura et al. | 257/62 |
| 2003/0008437 A1 | 1/2003 | Inoue et al. | |
| 2003/0038610 A1 | 2/2003 | Munshi et al. | |
| 2005/0110064 A1 | 5/2005 | Duan et al. | |
| 2006/0249755 A1* | 11/2006 | Kuo et al. | 257/209 |
| 2011/0174362 A1 | 7/2011 | Tanner et al. | |

\* cited by examiner

*Primary Examiner* — Ajay K Arora
(74) *Attorney, Agent, or Firm* — Birch, Stewart, Kolasch & Birch, LLP

(57) ABSTRACT

The invention discloses a method for fabricating power-generating module with solar cell. The method includes the steps of providing a flexible substrate; forming a solar cell unit on the flexible substrate by using a high density plasma at a temperature lower than about 150° C.; and forming a circuit unit on the flexible substrate; wherein the solar cell unit is coupled to the circuit unit, so as to provide the power needed for the operation of the circuit unit.

20 Claims, 5 Drawing Sheets

METHOD FOR FABRICATING POWER-GENERATING MODULE WITH SOLAR CELL

CROSS REFERENCE TO RELATED APPLICATIONS

This application is a Divisional of co-pending application Ser. No. 13/158,045 filed on Jun. 10, 2011, which claims priority to Application No. 100112482 filed in TW, on Apr. 11, 2011. The entire contents of all of the above applications are hereby incorporated by reference.

FIELD OF THE INVENTION

The present invention is related to a method for fabricating power-generating module with solar cell, and more particularly, the invention to a method for fabricating power-generating module that integrates thin film solar cell and circuit unit.

BACKGROUND OF THE INVENTION

In highly e-oriented era, all the tools needed in human life and work have integrated with some kinds of electronic components. For example, computer, cellular phone, camera, automobile and motorcycle, a variety of household appliance and manufacturing equipment, etc. Although e-oriented life has brought great convenience to human, due to the need of continuous power supply for the operation of electronic components, use of electrical power, such as battery or home/industrial level of DC or AC power is also increased accordingly.

Under the situation of limited traditional energy and easy generation of pollution, there is a need for new pollution-free energy. Therefore, many related organizations have devoted to the development of wind energy, tidal energy and solar energy. Therefore, many kinds of related power generating products have been developed, among them, the application in solar energy field is the most eye-catching one. With the development of semiconductor technology, a light and compact solar cell is now available in the market, in the meantime, it is integrated with some electronic products to provide the power needed for the operation of the electronic products.

In addition, in order to simplify the process of electronic product, reduce the manufacturing cost and expand the application scope, flexible substrate has been gradually introduced into the electronic product to replace traditional substrate. For example, plastic substrate has been used to replace the glass substrate in liquid crystal display to manufacture flexible display such as electronic paper. Due to the limited volume of such electronic products, if thin solar cells can be integrated therein, it will be helpful to improve the entire design structure and extending the utilization time. However, the glass transition temperatures of the frequently used flexible substrate today, such as poly ethylene naphthalate (PEN) and poly ethylene terephthalate (PET) are 80° C. and 120° C. respectively. This makes it difficult to take the high temperature in the process of plasma-enhanced chemical vapor deposition (PECVD) for the fabrication of solar cells. In addition, if the temperature of the process of PECVD is reduced, for example, lower than 150° C., then the photovoltaic conversion efficiency of the solar cell will be very poor.

SUMMARY OF THE INVENTION

Accordingly, the scope of the invention is to provide a method for fabricating power-generating module with solar cell to solve the above-mentioned problems of the prior art.

In an aspect of the invention is to provide a method for fabricating a power-generating module with solar cell to solve the above-mentioned problems of the prior art.

In an aspect of the invention, the method includes the following steps of: providing a flexible substrate; forming a solar cell unit on the flexible substrate by using a high density plasma at a temperature lower than 150° C.; and forming a circuit unit on the flexible substrate; wherein the solar cell unit is coupled to circuit unit to provide the power needed for the operation of the circuit unit. In one embodiment, the steps of forming the solar cell unit include the steps of forming a p-type layer, an i-type layer and a n-type layer sequentially, so as to form a p-i-n multi-layer structure. In practice, the process condition of the p-type layer includes a process pressure between 600 and 1200 mTorr, a process power between 30 and 60 W and a deposition rate between 2 and 5 A/s. In addition, the reaction gas to form the p-type layer includes SiH4 having a flow rate between 6 and 15 sccm; H2 having a flow rate between 100 and 250 sccm; B2H6 having a flow rate between 0.5 and 1.5 sccm; and Ar having a flow rate between 100 and 200 sccm.

In practice, the process condition of the i-type layer include a process pressure between 600 and 1200 mTorr, a process power between 15 and 40 W and a deposition rate between 1 and 2.5 A/s. In addition, the reaction gas to form the i-type layer includes SiH4 having a flow rate between 10 and 20 sccm; H2 having a flow rate between 100 and 250 sccm, and Ar having a flow rate between 100 and 200 sccm.

In practice, the process condition of the n-type layer includes a process pressure between 600 and 1200 mTorr, a process power between 30 and 60 W and a deposition rate between 2 and 4 A/s. In addition, the reaction gas to form the n-type layer includes SiH4 having a flow rate between 6 and 15 sccm; H2 having a flow rate between 100 and 250 sccm; PH3 having a flow rate between 0.5 and 1.5 sccm, and Ar having a flow rate between 100 and 200 sccm.

By using the high density plasma technology to form the power-generating module with solar cell, the invention has the following advantages of: low temperature growth, low ion bombardment, high deposition rate and enlargement of the area of the solar cell. Accordingly, the power-generating module with solar cell of the invention can be successfully formed on the flexible substrate to show high conversion efficiency and high electron mobility.

For the advantages and spirit regarding the present invention, further understanding can be achieved through the following detailed description and attached drawings of the present invention.

DETAILED DESCRIPTION OF THE INVENTION

The invention provides a power-generating module with solar cell and a method for fabricating the same. In the followings, the embodiments and practical applications of the invention are described in detail, so as to explain the features, spirit and advantages of the invention.

Figure 1:
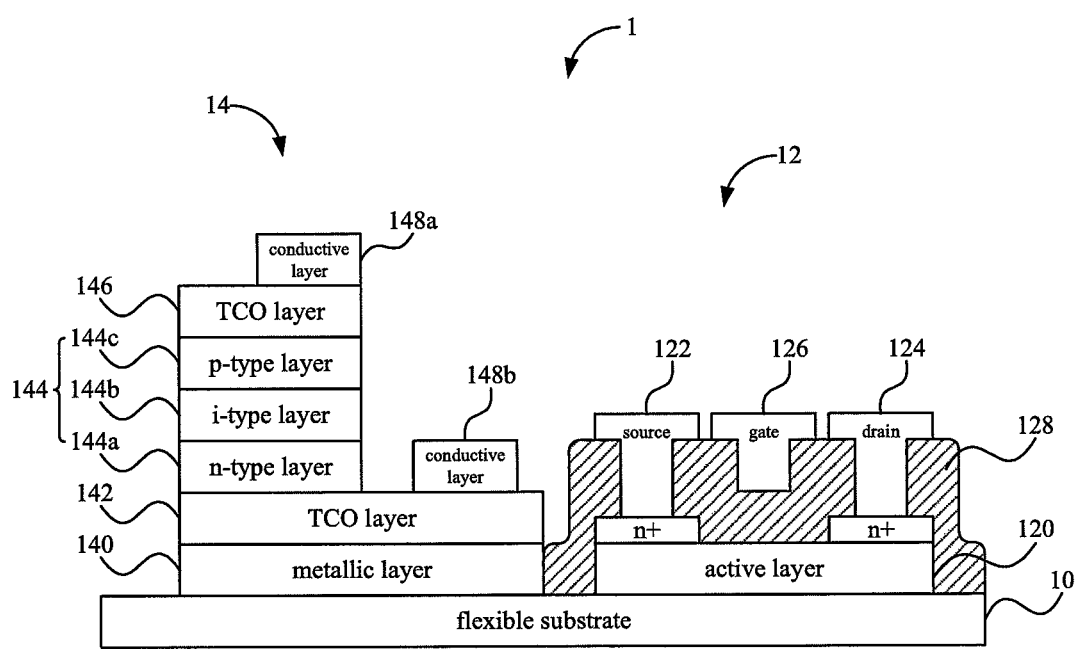
FIG. 1 illustrates a cross-sectional view of the power-generating module with solar cell according to one embodiment of the invention.

Please refer to FIG. 1, which illustrates the cross-sectional view of one embodiment of the power-generating module with solar cell of the current invention. As shown in the figure, the power-generating module with solar cell 1 of the invention mainly includes a flexible substrate 10, a thin film transistor 12 and a solar cell unit 14.

Wherein, both of the thin film transistor 12 and the solar cell unit 14 are formed on the flexible substrate 10. In practice, the flexible substrate 10 can be, but not limited to PEN substrate, PET substrate or polyimide substrate. In addition, the thin film transistor 12 of the embodiment can be replaced with any other suitable circuit unit, such as an electronic sensor and an electronic label, etc.

As shown in the figure, the thin film transistor 12 includes an active layer 120, a source electrode structure 122, a drain electrode structure 124, a gate electrode structure 126 and an insulating structure 128. The active layer 120 is formed on the flexible substrate 10; the source electrode structure 122 and the drain electrode structure 124 are all formed on the active layer 120; and the gate electrode structure 126 is formed in between the source electrode structure 122 and the drain electrode structure 124. The insulating structure 128 encloses the active layer 120, the source electrode structure 122, the drain electrode structure 124 and the gate electrode structure 126. In addition, the thin film transistor 12 can include several contact structures (not shown), which are formed on the source electrode structure 122, the drain electrode structure 124 and the gate electrode structure 126 respectively, and exposed out of the insulating structure 128. In practice, the insulating structure 128 can be made of SiO2 or other suitable material.

As shown in the figure, the solar cell unit 14 includes: a metallic layer 140, a first oxide layer 142, a p-i-n multi-layer structure 144, a second oxide layer 146, a first conductive layer 148a and a second conductive layer 148b.

Wherein, the metallic layer 140 is formed on the flexible substrate 10, and the metallic layer 140 can be made of Aluminum or other suitable material. The first oxide layer 142 is formed on the metallic layer 140, and the first oxide layer 142 can be made of transparent conducting oxide (TCO) or other suitable material.

The p-i-n multi-layer structure 144 is formed on the first oxide layer 142. In addition, the p-i-n multi-layer structure 144 includes a n-type layer 144a, an i-type layer 144b and a p-type layer 144c. In practice, the n-type layer 144a, the i-type layer 144b and the p-type layer 144c can be hydrogenated amorphous silicon (a-Si:H) or other suitable material.

Second oxide layer 146 is formed on the p-i-n multi-layer structure 144, and the second oxide layer 146 can be made of Indium Tin Oxide (ITO) or other suitable material. In addition, the first conductive layer 148a is formed on the second oxide layer 146, and second conductive layer 148b is formed on the first oxide layer 142. In practice, the first conductive layer 148a and the second conductive layer 148b can be made of Aluminum or other suitable material.

Figure 2:
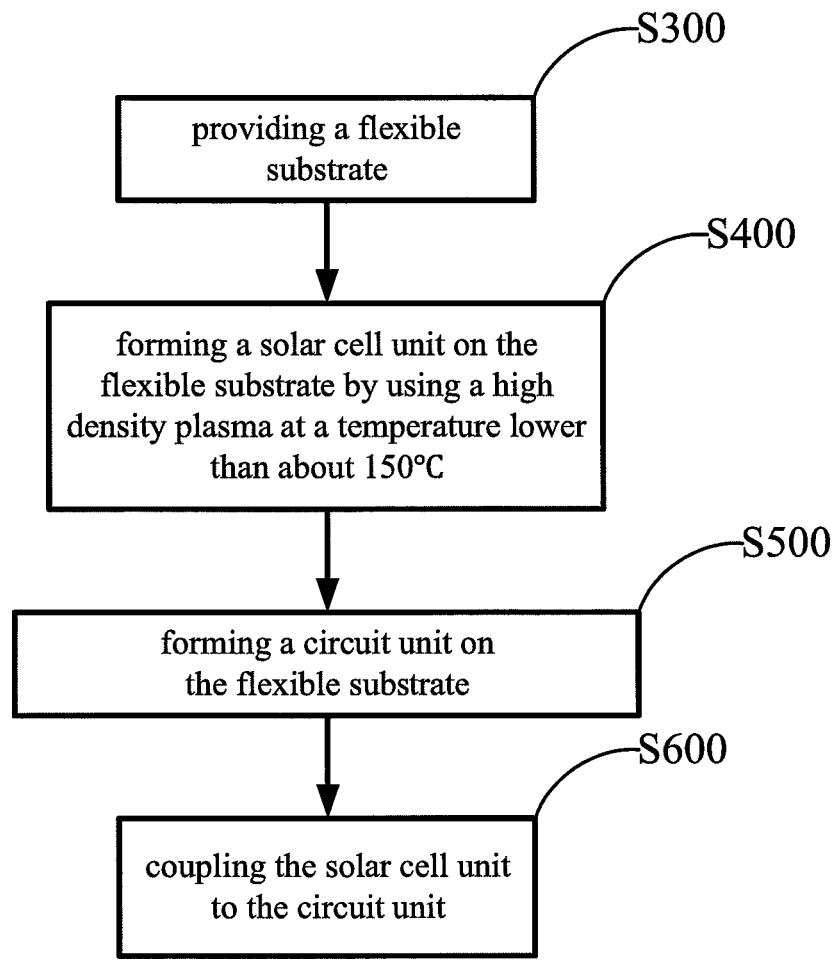
FIG. 2 illustrates a flow chart of the method of fabricating the power-generating module with solar cell based on one embodiment of the invention.
Figure 3:
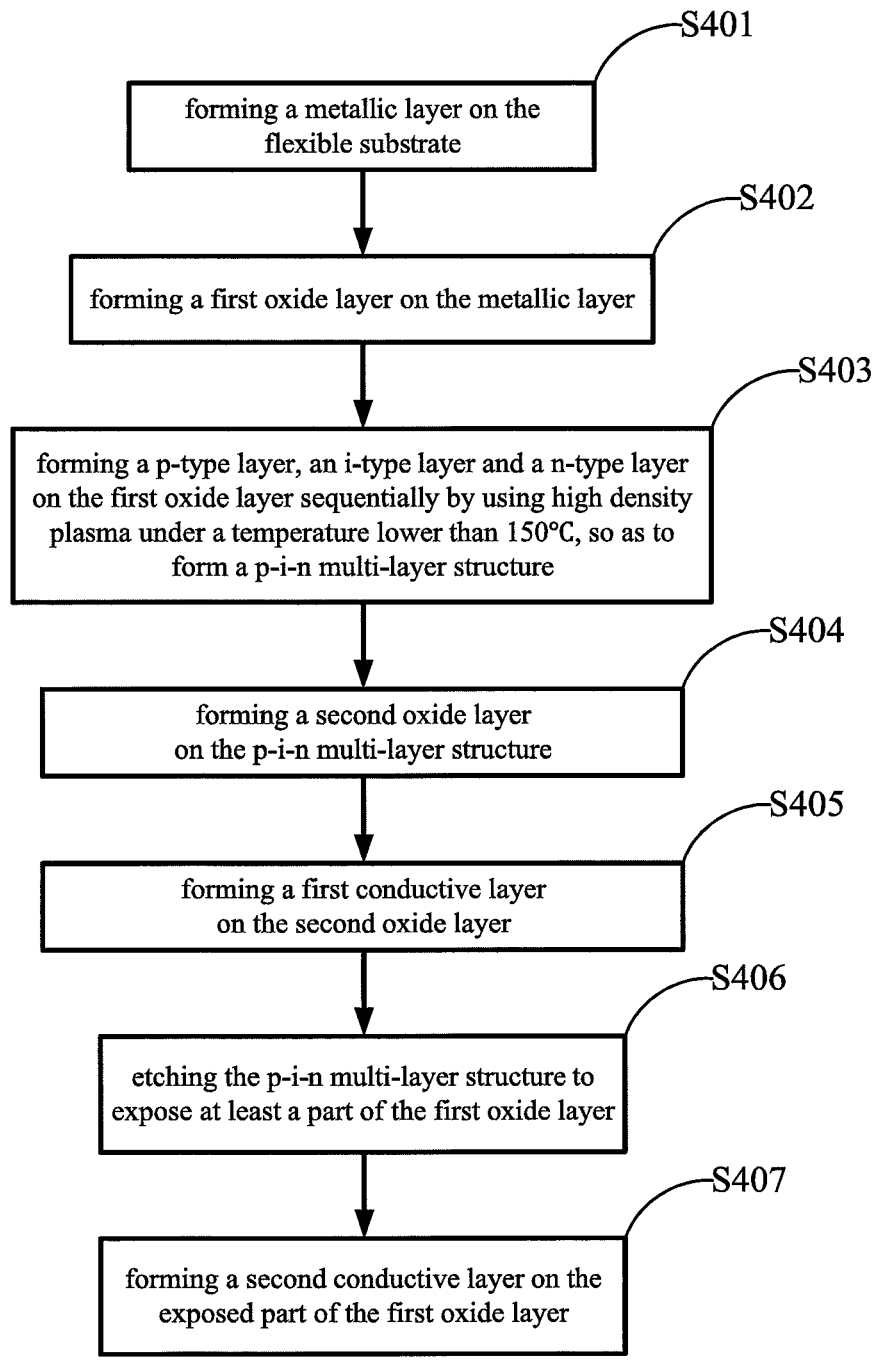
FIG. 3 illustrates the flow chart of step S400 in FIG. 2.

Additionally, in practice, the solar cell unit 14 can be coupled to the thin film transistor 12 through circuit (not shown). The circuit can be a voltage and current control circuit, or other suitable circuit. Please refer to FIG. 2, which shows a flow chart of the method of fabricating the power-generating module with solar cell according to one preferred embodiment of the invention. As shown in the figure, the method includes the following steps:

Step S300, providing a flexible substrate, which can be PET, PEN, polyimide or other suitable substrate, as described above. Step S400, forming a solar cell unit on the flexible substrate by using a high density plasma at a temperature lower than 150° C. Step S500, forming a circuit unit on the flexible substrate, as described above, the circuit unit can be thin film transistor or other suitable circuit units. Step S600, coupling the solar cell unit to the circuit unit, so that the solar cell unit can provide the power needed for the operation of the circuit unit. Please note that, in practice, the order of the above-mentioned steps can be optionally changed, and is not limited to the embodiment. Please refer to FIG. 3, which further illustrates a flow chart of S400 of FIG. 2. As shown in the figure, step S400 can further includes the following steps of:

Step S401, forming a metallic layer on the flexible substrate. Step S402 forming a first oxide layer on the metallic layer. In practice, the first oxide layer can be formed by sputtering or other suitable method. Step 403, forming a n-type layer, an i-type layer and a p-type layer on the first oxide layer sequentially by using high density plasma at a temperature lower than 150° C., to form a p-i-n multi-layer structure.

Step 404, forming a second oxide layer on the p-i-n multi-layer structure. In practice, the second oxide layer can be formed by sputtering or other methods. Step S405, forming a first conductive layer on the second oxide layer. Step S406, etching the p-i-n multi-layer structure so as to expose at least a part of the first oxide layer. Step S407, forming a second conductive layer above the exposed part of the first oxide layer.

Please note that, step S406 can be carried out optionally, or be replaced with other step(s). Additionally, in practice, the first conductive layer and the second conductive layer can be formed by electron gun or other suitable method.

The process conditions of the above steps will be described in more detail as follows.

Please refer to table 1, which lists the process parameters of the p-i-n multi-layer structure of the solar cell.

The process conditions of the n-type layer include a process pressure between 600 and 1200 mTorr, a process power between 30 and 60 W, a process temperature between 60 and 150° C., and a deposition rate between 2 and 4 A/s. Meanwhile, in one embodiment, the n-type layer can be formed of a reaction gas mixture including SiH4, H2, PH3 and Ar, wherein the flow rate of SiH4 is between 6 and 15 sccm, the flow rate of H2 is between 100 and 250 sccm, the flow rate of PH3 is between 0.5 and 1.5 sccm, and the flow rate of Ar is between 100 and 200 sccm.

The process conditions of the i-type layer include a process pressure between 600 and 1200 mTorr, a process power between 15 and 40 W, a process temperature between 60 and 150° C. and a deposition rate between 1 and 2.5 A/s. Meanwhile, in one embodiment, the i-type layer can be formed of a reaction gas mixture including SiH4, H2 and Ar, wherein the flow rate of SiH4 is between 10 and 20 sccm, the flow rate of H2 is between 100 and 250 sccm, and the flow rate of Ar is between 100 and 200 sccm.

The process conditions of the p-type layer include a process pressure between 600 and 1200 mTorr, a process power between 30 and 60 W, a process temperature between 60 and 150° C. and a deposition rate between 2 and 5 A/s. Meanwhile, in one embodiment, the p-type layer can be formed of a mixture of reaction gas including SiH4, H2, B2H6 and Ar, wherein the flow rate of SiH4 is between 6 and 15 sccm, the flow rate of H2 is between 100 and 250 sccm, the flow rate of B2H6 is between 0.5 and 1.5 sccm, and the flow rate of Ar is between 100 and 200 sccm.

TABLE 1

| Layer | SiH4:H2 (sccm) | Doping gas/ flow rate (sccm) | Ar (sccm) | Pressure (mTorr) | power | Thickness | Dep. rate (A/s) |
|---|---|---|---|---|---|---|---|
| p | 10:200 | B2H6/ 1.3 | 200 | 900 | 52 | 12 | 3.1 |
| i | 15:150 | — | 100 | 700 | 18 | 400 | 1.3 |
| n | 10:200 | PH3/0.5 | 200 | 900 | 45 | 20 | 1.73 |

Figure 4A:
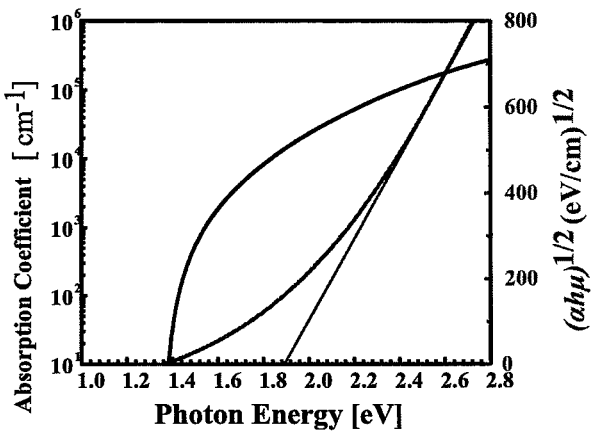
FIGS. 4A, 4B and 4C illustrate respectively charts made based on the p-type layer, i-type layer and n-type layer of one embodiment of the invention.
Figure 4B:
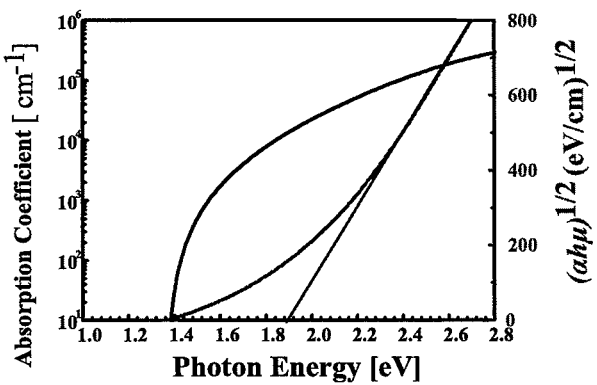
Figure 4C:
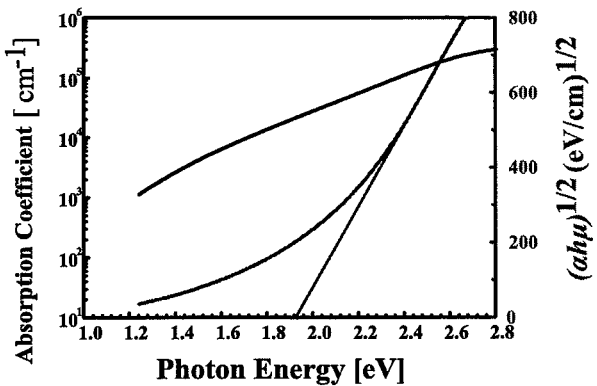

The characteristics of layers formed are illustrated sequentially in FIG. 4A (p-type layer), FIG. 4B (i-type layer) and FIG. 4C (n-type layer).

The process conditions of the second oxide layer include a process pressure between 50 and 80 mTorr, a process power between 200 and 500 W, a process temperature between 80 and 150° C., and a deposition rate between 1 and 2 A/s. In addition, the etching conditions of step 406 include a process pressure between 5 and 30 mTorr, and CF4 with a flow rate between 150 and 200 sccm and Ar with a flow rate between 50 and 100 sccm is used.

Figure 5A:
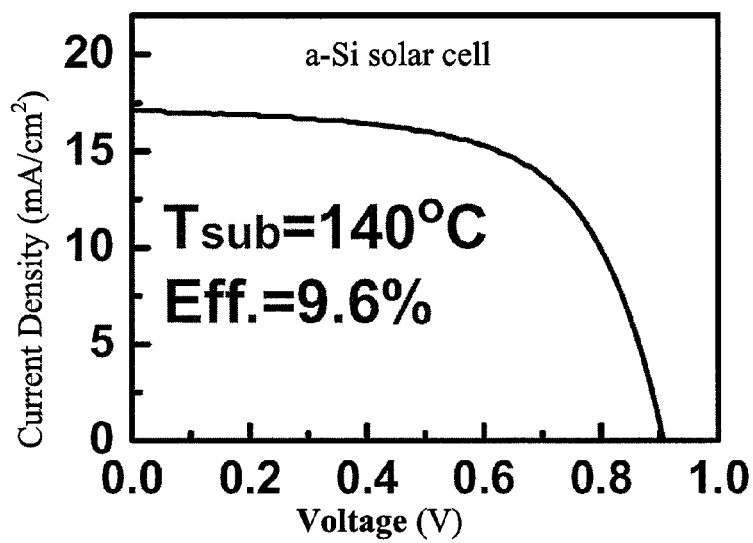
FIGS. 5A and 5B illustrate the voltage, current density, wavelength and quantum efficiency of the amorphous silicon thin film solar cell unit of one embodiment of the invention, the solar cell unit is formed by using high density plasma technology at a process temperature of 140° C.
Figure 5B:
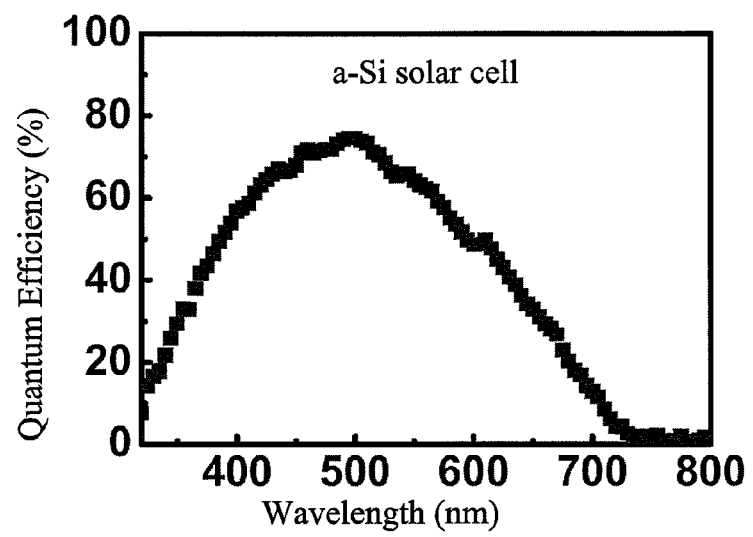

Please refer to FIGS. 5A and 5B, which shows, based on an embodiment of the invention, the voltage, current density, wavelength and quantum efficiency of an amorphous silicon thin film solar cell unit (with p-i-n multi-layer structure having a thickness of 400 nm) deposited by using high density plasma technology at a process temperature of 140° C. In addition, the photovoltaic conversion efficiency of the amorphous silicon thin film solar cell unit is measured as 9.6%.

In another embodiment, when the amorphous silicon solar cell with the p-i-n multi-layer structure having a thickness of 300 nm is fabricated under process temperatures of 140° C., 90° C. and 60° C. respectively, the photovoltaic conversion efficiencies of the solar cell are 9.6%, 6.9% and 4.6% respectively. In addition, from related experiments, the open circuit voltage, fill factor, conversion efficiency and efficiency spectrum of the solar cell are all shown to tend to be optimized with the rising of temperature.

In addition, even if the process temperature is lowered to 60° C., the dark saturation current of the amorphous silicon thin film deposited by using inductive plasma coupling technology can still be lower than 6×10-8 A/cm2. This proves that even under low temperature, the defect density of the amorphous thin film fabricated in the invention is still very low.

Through the confirmation of experiment, the Si thin film deposited by using the method of the invention can be evenly deposited no matter on planarized or roughening substrate, and no discontinuity or vacancy will be generated on the interface between Si thin film and transparent conductive layer, so as to reach a extreme broad band quantum efficiency spectrum (300 to 750 nm).

In practice, the thin film transistor of the invention can be formed, at a process temperature of 140° C., by using inductive coupling plasma technology. The electron mobility of the thin film transistor is measured to be about 1.1 cm2N-s, and the thin film transistor can have a very high driving current. In addition, the thin film transistor can have a very low dangling bond density, which results in a low sub-threshold swing and low off-state current.

To sum up, because the power-generating module with solar cell of the invention is formed by using high density plasma technology, it has advantages such as low temperature growth, low ion bombardment, high deposition rate and enlargement of the area of the solar cell. Therefore, the power-generating module with solar cell of the invention can be successfully formed on the flexible substrate with characteristics such as high conversion efficiency and high electron mobility.

While the foregoing is directed to embodiments of the present invention, other and further embodiments of the invention may be devised without departing from the basic scope thereof, and the scope thereof is determined by the claims that follow.

What is claimed is:

1. A method for fabricating a power-generating module with solar cell, comprising the following steps of:
    providing a flexible substrate;
    forming a solar cell unit on the flexible substrate by using a high density plasma at a temperature lower than about 150° C.; and
    forming a circuit unit on the flexible substrate;
    wherein the solar cell unit is coupled to the circuit unit, so as to provide the power needed for the operation of the circuit unit, and
    wherein forming the solar cell unit further comprises the following steps of:
        forming a first oxide layer on the flexible substrate;
        forming a p-i-n multi-layer structure on the first oxide layer by using the high density plasma at a temperature lower than 150° C.; and
        forming a second oxide layer on the p-i-n multi-layer structure.

2. The method of claim 1, wherein the photovoltaic conversion efficiency of the solar cell unit is about 9.6%.

3. The method of claim 1, wherein forming the solar cell unit further comprises the following steps of:
    forming a metallic layer on the flexible substrate;
    forming a first conductive layer on the second oxide layer; and
    forming a second conductive layer on the first oxide layer.

4. The method of claim 3, wherein the p-i-n multi-layer structure is a hydrogenated amorphous silicon structure.

5. The method of claim 3, further comprising the following steps in between the step of forming the first conductive layer and the step of forming the second conductive layer:
    etching the p-i-n multi-layer structure to expose at least a part of the first oxide layer, and the second conductive layer is formed on the exposed part of the first oxide layer.

6. The method of claim 1, wherein the step of forming the p-i-n multi-layer structure further comprises the following steps of:
    (c1) forming a n-type layer on the first oxide layer under a first process condition, wherein the first process condition comprises a process pressure between 600 and 1200 mTorr, a process power between 30 and 60W and a deposition rate between 2 and 4 A/s;
    (c2) forming an i-type layer on the n-type layer under a second process condition, wherein the second process condition comprises a process pressure between 600 and 1200 mTorr, a process power between 15 and 40W and a deposition rate between 1 and 2.5 A/s; and (c3) forming a p-type layer on the i-type layer under a third process condition, wherein the third process condition comprises a process pressure between 600 and 1200 mTorr, a process power between 30 and 60W and a deposition rate between 2 and 5 A/s.

7. The method of claim 6, wherein in step (c1), the n-type layer is formed of a first reaction gas mixture, which comprises SiH4, H2, PH3 and Ar, wherein the flow rate of SiH4 is between 6 and 15 sccm, the flow rate of H2 is between 100 and 250 sccm, the flow rate of PH3 is between 0.5 and 1.5 sccm, and the flow rate of Ar is between 100 and 200 sccm.

8. The method of claim 6, wherein in step (c2), the i-type layer is formed of a second reaction gas mixture, which comprises SiH4, H2 and Ar, wherein the flow rate of SiH4 is between 10 and 20 sccm, the flow rate of H2 is between 100 and 250 sccm, and the flow rate of Ar is between 100 and 200 sccm.

9. The method of claim 6, wherein in step (c3), the p-type layer is formed of a third reaction gas mixture, which comprises SiH4, H2, B2H6 and Ar, wherein the flow rate of SiH4 is between 6 and 15 sccm, the flow rate of H2 is between 100 and 250 sccm, the flow rate of B2H6 is between 0.5 and 1.5 sccm, and the flow rate of Ar is between 100 and 200 sccm.

10. The method of claim 3, wherein the first oxide layer is formed of transparent conducting oxide (TCO), and the second oxide layer is formed of Indium Tin Oxide (ITO).

11. The method of claim 1, wherein the flexible substrate is a PEN substrate, a PET substrate or a polyimide substrate.

12. The method of claim 1, wherein the circuit unit is made of inductive coupling plasma technology.

13. A method for fabricating a power-generating module with solar cell, comprising the following steps of:
providing a flexible substrate;
forming a solar cell unit on the flexible substrate by using a high density plasma at a temperature lower than about 150° C.; and
forming a thin film transistor on the flexible substrate;
wherein the solar cell unit is coupled to the thin film transistor, so as to provide the power needed for the operation of the thin film transistor, and
wherein forming the solar cell unit further comprises the following steps of:
forming a first oxide layer on a metallic layer;
forming a p-i-n multi-layer structure on the first oxide layer by using the high density plasma at a temperature lower than 150° C.; and
forming a second oxide layer on the p-i-n multi-layer structure.

14. The method of claim 13, wherein the photovoltaic conversion efficiency of the solar cell unit is about 9.6%.

15. The method of claim 13, wherein forming the thin film transistor further comprises the following steps of:
forming an active layer on the flexible substrate;
forming a source electrode structure and a drain electrode structure on the active layer;
forming a gate electrode structure between the source electrode structure and the drain electrode structure.

16. The method of claim 13, wherein forming the solar cell unit further comprises the following steps of:
forming the metallic layer on the flexible substrate;
forming a first conductive layer on the second oxide layer; and
forming a second conductive layer on the first oxide layer.

17. A method for fabricating a power-generating module with solar cell, comprising the following steps of:
providing a flexible substrate;
forming a silicon film solar cell on the flexible substrate by using a high density plasma at a temperature lower than about 150° C.; and
forming a circuit unit on the flexible substrate;
wherein the silicon film solar cell is coupled to the circuit unit, so as to provide the power needed for the operation of the circuit unit, and
wherein forming the silicon thin solar cell further comprises the following steps of:
forming a first oxide layer on a metallic layer;
forming a p-i-n multi-layer structure on the first oxide layer by using the high density plasma at a temperature lower than 150° C.; and
forming a second oxide layer on the p-i-n multi-layer structure.

18. The method of claim 17, wherein the photovoltaic conversion efficiency of the solar cell unit is about 9.6%.

19. The method of claim 17, wherein forming the circuit unit further comprises the following steps of:
forming an active layer on the flexible substrate;
forming a source electrode structure and a drain electrode structure on the active layer;
forming a gate electrode structure between the source electrode structure and the drain electrode structure.

20. The method of claim 17, wherein forming the silicon thin solar cell further comprises the following steps of:
forming the metallic layer on the flexible substrate;
forming a first conductive layer on the second oxide layer; and
forming a second conductive layer on the first oxide layer.

* * * * *